United States Patent
Dessard et al.

(10) Patent No.: US 12,095,456 B2
(45) Date of Patent: Sep. 17, 2024

(54) FAST DIGITAL ISOLATOR

(71) Applicant: Navitas Semiconductor Limited, Dublin (IE)

(72) Inventors: Vincent Dessard, Mont-Saint-Guibert (BE); Aimad Saib, Gembloux (BE)

(73) Assignee: Navitas Semiconductor Limited, Dublin (IE)

( * ) Notice: Subject to any disclaimer, the term of this patent is extended or adjusted under 35 U.S.C. 154(b) by 0 days.

(21) Appl. No.: 17/789,757

(22) PCT Filed: Dec. 24, 2020

(86) PCT No.: PCT/EP2020/087878
§ 371 (c)(1),
(2) Date: Jun. 28, 2022

(87) PCT Pub. No.: WO2021/136745
PCT Pub. Date: Jul. 8, 2021

(65) Prior Publication Data
US 2023/0058123 A1  Feb. 23, 2023

(30) Foreign Application Priority Data
Dec. 31, 2019 (EP) ...................... 19220251

(51) Int. Cl.
*H03K 19/0175* (2006.01)
*H02H 9/02* (2006.01)
(Continued)

(52) U.S. Cl.
CPC ....... *H03K 19/017545* (2013.01); *H02H 9/02* (2013.01); *H03K 5/24* (2013.01); *H03K 19/003* (2013.01); *H03K 19/09429* (2013.01)

(58) Field of Classification Search
CPC ................ H03H 9/02; G11C 11/40615; H03K 19/017545; H03K 5/24; H03K 19/09429
(Continued)

(56) References Cited

U.S. PATENT DOCUMENTS 6,144,326 A   11/2000 Krone
2008/0136442 A1   6/2008 Chen
(Continued)

FOREIGN PATENT DOCUMENTS

CN   105897251 A   8/2016
WO   WO-2020011801 A1 *  1/2020 ............. G08C 19/00

OTHER PUBLICATIONS

Extended European Search Report from related application, EP23179008.0, mailed Dec. 12, 2023, 6 pages.
(Continued)

*Primary Examiner* — Arnold M Kinkead
(74) *Attorney, Agent, or Firm* — Fisher Broyles, LLP (57) ABSTRACT

A digital isolator. The digital isolator a logic module for receiving an input signal D, and providing command signals to first and second sawtooth modulators. The first sawtooth modulator can provide a first sawtooth signal at a node A1 having a fast rising edge triggered by a rising edge of a control signal, followed by a slow falling edge, when D equals 1 and having a fast falling edge triggered by a rising edge of a control signal, followed by a slow rising edge, when D equals 0. A second sawtooth modulator provides a second sawtooth signal at node A2, inverted with respect to first sawtooth signal. Isolation capacitors connected to nodes A1 and A2 can be used as isolation barrier and as part of high-pass filters together with dipoles Z1 and Z2.

19 Claims, 7 Drawing Sheets

(51) Int. Cl.
*H03K 5/24* (2006.01)
*H03K 19/003* (2006.01)
*H03K 19/094* (2006.01)

(58) Field of Classification Search
USPC .............................. 327/333, 206; 326/30, 21
See application file for complete search history.

(56) References Cited

U.S. PATENT DOCUMENTS

| | | | |
|---|---|---|---|
| 2009/0295451 A1* | 12/2009 | Jordanger | H04L 25/4902 |
| | | | 327/333 |
| 2012/0161841 A1 | 6/2012 | Dong | |
| 2013/0207687 A1 | 8/2013 | Honda | |
| 2015/0171901 A1 | 6/2015 | Dupuis | |
| 2016/0126724 A1 | 5/2016 | Yun | |

OTHER PUBLICATIONS

Jing, Qiu, et al., "DC Signal Transmission Technology Based on V/F and F.V Conversion," China Academic Journal Electronic Publishing House, Dec. 2016, 5 pages.

Office Action issued in related application, CN2020800934397, issued May 17, 2024, 5 pages.

* cited by examiner

FAST DIGITAL ISOLATOR

CROSS-REFERENCE TO RELATED APPLICATIONS

This application is a 371 U.S. National Phase of PCT International Patent Application No. PCT/EP2020/087878, filed on 24 Dec. 2020, which claims benefit and priority to European Patent Application No. 19220251.3, filed on 31 Dec. 2019; the disclosures of which are each incorporated by reference herein in their entirety for all purposes.

FIELD OF THE INVENTION

The present invention generally relates to the field of capacitive isolation links.

The invention relates to the field of capacitive isolation systems for use in isolating electrical circuits from one another while transmitting digital information data. More particularly, this invention relates to isolation systems having capacitor-coupled isolation barriers. This is useful in, for example, industrial process control application, telephony, medical electronics, data communication.

DESCRIPTION OF PRIOR ART

Isolators are generally implemented to separate circuits or circuit sections of the electrical circuit to one another from undesired influence of, as for example but not limiting, other circuits or circuit sections, to minimize the influence of common mode transients (CMT), influence of radiation or electromagnetic interferences, cross talk, between circuits or circuit sections. Capacitive isolation links are also used to minimize the transmission of interferences introduced by the environment from one circuit to another or from one section of a circuit to one another. It is also used in galvanic isolation, to isolate high voltages from one another or to isolate low voltage command circuits to high voltage power circuits. Capacitive isolation links also allow better integration compared to other systems based for example on electromagnetic isolators.

Capacitive isolation links usually make use of a dielectric in order to block direct current between isolated circuits sections of the electrical circuits or to block lowest-frequency currents between the circuits sections while allowing transfer of a higher frequency data signal. The isolation barrier usually includes one or more capacitors or transformers. For this reason, information data shape commonly used is square signals with very fast transients used for the edges of the signal followed by a maintained information level (no transient information) allowing to transmit only the edge variation of the signal through the capacitive barrier. The output signal of the capacitive isolation link is typically delayed with respect to the corresponding input. Also, a "jitter' may occur, i.e. the delay may vary in time.

Nevertheless, common mode transients (CMT) may be caused by switching different supply voltages and grounds that are present at different circuits or circuits sections or as the result of external interferences such as for example, radiation or electromagnetic fields, or by other causes. As a consequence, high frequency transients can corrupt the data transmission of a data signal across the isolation barrier. It is well known that addressing the effect of the CMT in a digital isolator is a challenge in designing such digital isolators.

Document SLLA284B (dated January 2009—Revised August 2018) "Digital Isolator Design Guide" from Texas Instrument, discloses capacitive isolation link devices including two differential data links: a high-frequency channel (HF) with a bandwidth generally from 100 kbps up to 150 Mbps, and a low-frequency channel (LF) covering the range below down to dc. In principle, a single-ended input signal entering the HF-channel is split into a differential signal via the inverter gate at the input. The following capacitor-resistor networks differentiate the signal into small and narrow transients, which then are converted into rail-to-rail differential pulses by two comparators. The comparator outputs drive a NOR-gate flip-flop whose output feeds an output multiplexer. A decision logic (DCL) at the driving output of the flip-flop measures the durations between signal transients. If the duration between two consecutive transients exceeds a certain time limit (as in the case of a low-frequency signal) the DCL forces the output-multiplexer to switch from the high-frequency to the low-frequency channel. Because low-frequency input signals require the internal capacitors to assume prohibitively large values, these signals are pulse-width modulated (PWM) with the carrier frequency of an internal oscillator, thus creating a sufficiently high frequency, capable of passing the capacitive barrier. As the input is modulated, a low-pass filter (LPF) is needed to remove the high-frequency carrier from the actual data before passing it on to the output multiplexer.

Document US2017/0302225A1 discloses a system where the input circuit includes an on-off keying (OOK) modulator configured to generate a modulated data signal in response to the input data signal and the carrier signal. The output circuit includes a frequency shift keying (FSK) demodulator configured to detect a presence of the carrier signal in the modulated differential data signal and generate a demodulated data signal in response to the presence of the carrier signal.

Document EP0973305A1 discloses a capacitive insulating barrier system with a sawtooth signal as a carrier to generate a Pulse Width Modulation (PWM) signal as an input signal of the capacitive insulation barrier. There are two capacitors between input and output circuit which provide isolation between input and output circuits. A square pulse width modulated signal is used as transmitted signal from one side of the isolation barrier to the other.

Conventional capacitive links cannot transmit states but only transients such that when using a single capacitor, the system cannot make the difference between a parasitic and a transition of the data state to be transmitted. Therefore, two capacitors are used to transmit data on a differential way so that the unwanted parasitic noise can be removed. But using only two capacitors directly with the signal to be transmitted is risky. Indeed, in case of wrong communication for any reason such as described previously, the output signal can be stated in the wrong state and could theoretically remain in the wrong state for a long time until some correction can be made or until a new state to be transmitted is defined. This could lead to a fatal failure in some applications. For this reason, many designs include a second pair of capacitors that is intended to transmit a modulated version of the data signal instead of the data signal itself. With a modulated square data signal, there is always a state change so that the capacitive link will transmit it. In case of "wrong pulse", it will be promptly corrected at the next edge of the modulated signal so that no fatal failure can happen.

However, with this second channel, as the input signal is modulated with a carrier frequency that is either asynchronous or synchronous with the input signal, the modulated signal further needs to be demodulated. This adds delay and/or jitter. This can be critical or not, depending on the final application.

In the capacitive links, a square or sinusoidal signal is applied at the input of a capacitive link. In case of sinusoidal waves, a specific demodulator is required, leading to some delay and jitter. It can also require some magnetics to generate such waveforms. In case of square waves, the capacitor will always transmit a rising edge followed by a constant state and then by a falling edge. The capacitive link is a high pass filter. These solutions usually require a demodulator in the receiver circuit to extract the envelope of the signal. This involves some time constant, leading to additional delay and/or output jitter as well as extra demodulation or detection circuits that increase the system size and limits its integration.

SUMMARY OF THE INVENTION

It is an object of the present invention to provide digital isolator for receiving a digital signal D and for transmitting said signal through an isolation link, the isolation link being a single differential capacitive, the digital isolator having a reduced delay and a high performance.

According to a first aspect, the invention provides a digital isolator for receiving a digital signal D, having high- or low-state pulses of duration larger than TD0 with reference to a first ground G1, and providing corresponding signals to output node S and output node R with reference to a second ground G2. The digital isolator comprises
- a logic module configured to receive said digital signal D, comprising:
  - a generator for generating a pulse signal $CK_{pls}$;
  - a delay generator for producing a digital signal $D_D$ having a fast rising edge a delay TD1 after a rising edge of D and a fast falling edge a delay TD1' after a falling edge of D;
- and configured to provide a first command signal and a second command signal,
- a first sawtooth modulator for receiving said first command signal, and configured for providing a first sawtooth signal at a node A1, said first sawtooth signal having
  - as long as $D=D_D$,
    - as long as no $CK_{pls}$ pulse signal occurs, a slow falling edge possibly followed by a low-state plateau if $D_D=1$ or a slow rising edge possibly followed by a high-state plateau if $D_D=0$;
    - during the occurrence of pulse signal $CK_{pls}$, the value of $D_D$;
  - as long as $D=not(D_D)$,
    - the value of $D_D$;
  - at any transition of $D_D$,
    - the value of $D_D$;
- a second sawtooth modulator for receiving said second command signal, and configured for providing a second sawtooth signal at a node A2, said second sawtooth signal having
  - as long as $D=D_D$,
    - as long as no $CK_{pls}$ pulse signal occurs, a slow falling edge possibly followed by a low-state plateau if $D_D=0$ or a slow rising edge possibly followed by a high-state plateau if $D_D=1$,
    - during the occurrence of pulse signal $CK_{pls}$, the value of $not(D_D)$;
  - as long as $D=not(D_D)$:
    - the value of $not(D_D)$;
  - at any transition of $D_D$:
    - the value of $not(D_D)$;
- a first capacitive coupling connected to said node A1, and to a node B1;
- a first dipole Z1 connected between said node B1 and a bias voltage source with reference to a second ground G2;
- a second capacitive coupling connected to said node A2, and to a node B2;
- a second dipole Z2 connected between said node B2 and said bias voltage source;
- a first threshold comparator having a first input connected to said node B1, and a second input connected to said node B2, producing a digital signal at output node S having a high-state value when its first input exceeds its second input by a threshold Th1, and a low-state value otherwise;
- a second threshold comparator (having a first input connected to said node B2, and a second input connected to said node B1, producing a digital signal at output node R having a high-state value when its first input exceeds its second input by a threshold Th2, and a low-state value otherwise.

The durations of the slow falling or rising edges depend on the components of the circuits. A low- or high-state plateau will occur after a slow falling or slow rising edge respectively if no rising or falling edge occurs in the sawtooth signals. The thresholds Th1 and Th2 are selected such that pulse at nodes S and R occur when signals at nodes A1 and A2 have fast rising of falling transitions.

Said logic module may comprise a circuit for producing a signal $D_{pls}$ having low state pulses of duration TD3 during or after each transition of signal $D_D$; and/or a circuit for producing a signal CTRL being equal to the logic combination of a low-state pulse when pulse signal $CK_{pls}$ occurs AND $D_{pls}$.

According to an embodiment, said first sawtooth modulator produces at node A1
when D=0, $D_D$=0 and CTRL=1, a slow rising edge;
when D=0, $D_D$=0 and CTRL=0, a low-state plateau;
when D=1, $D_D$=1 and CTRL=1, a slow falling edge;
when D=1, $D_D$=1 and CTRL=0, a high-state plateau;
when D=0, $D_D$=1 and CTRL=1, a high-state plateau;
when D=0, $D_D$=1 and CTRL=0, a high-state plateau;
when D=1, $D_D$=0 and CTRL=1, a low-state plateau;
when D=1, $D_D$=0 and CTRL=0, a-low state plateau.

Said first and/or said second capacitive coupling may be implemented as a one or more capacitors connected in series.

Said duration TD1 may advantageously be equal to TD1'.
Said first command signal may comprise digital signals SU1, SD1, WU1 and WD1, and said second command signal may comprise digital signals SU2, SD2, WU2 and WD2,
SU1 being equal to 1 when D=0 and $D_D$=0 or when D=1 and $D_D$=1 and CTRL=1 or when D=1 and $D_D$=0, SU1 being equal to 0 otherwise;
SD1 being equal to 0 when D=0 and $D_D$=0 and CTRL=1, or when D=1 and $D_D$=1 or when D=0 and $D_D$=1 and equal to 1 otherwise;
WU1 and WD1 being equal to 0 when D=0 and $D_D$=0 and CTRL=1, WU1 and WD1 being equal to 1 when D=1 and $D_D$=1 and CTRL=1, WU1 and WD1 being equal to either 0 or 1 otherwise;
SU2 being equal to not(SD1);
SD2 being equal to not(SU1);

WU2 and WD2 being equal to 1 when D=0 and $D_D$=0 and CTRL=1, WU2 and WD2 being equal to 0 when D=1 and $D_D$=1 and CTRL=1, WU2 and WD2 being equal to either 1 or 0 otherwise.

The digital isolator may comprise an SR latch, said signals at output nodes R and S being connected to corresponding inputs of said SR latch.

The first sawtooth modulator may comprise a first low impedance controllable switch LU1 connected between a first power supply voltage V1 and said output node A1, being closed when command signal SU1 is equal to 0 and open otherwise;

a second low impedance controllable switch LD1 connected between said node A1 and said first ground G1, being closed when command signal SD1 is equal to 1 and open otherwise;

a first controllable switch MU1 connected in series with a current limiting dipole ILU1 between said first power supply voltage V1 and said node A1, said first controllable switch MU1 being open when command signal WU1 is equal to 1 and closed otherwise;

a second controllable switch MD1 connected in series with a current limiting dipole ILD1 between said node A1 and said first ground G1, said second controllable switch being closed when command signal WD1 is equal to 1 and open otherwise;

a capacitor Cp1 between said node A1 and ground G1.

The components ILU1, ILD1, Cp1 of said first sawtooth modulator may be selected such that the durations of the slow rising and/or slow falling edges of said signal at node A1 are at least two times, four times or more preferably ten times the durations of the fast rising and/or fast falling edges of said signal at node A1. The duration of the slow or fast rising edges may be determined as being the time needed for reaching a ratio such as 80% of a power supply voltage. The duration of the slow or fast falling edges may be determined as being the time needed for falling down to a ratio such as 20% of a power supply voltage.

The second sawtooth modulator may comprise corresponding same elements.

The components ILU2, ILD2, Cp2 of said second sawtooth modulator are selected such that the durations of the slow rising and/or slow falling edges are at least two times, four times or more preferably ten times the durations of the fast rising and/or fast falling edges at said signal at node A2.

According to a second aspect, the invention provides a method for isolating a digital signal D having high- or low-state pulses of duration larger than TD0, with reference to a first ground G1, and for providing corresponding possibly redundant signals to output node S and output node R with reference to a second ground G2, using an isolator according to the invention, and the steps as claimed.

The method may comprise the step of feeding said signals at output nodes R and S to corresponding inputs of an SR latch.

In the context of the present invention, a sawtooth signal may comprise fast/slow rising/falling edges and low-high state plateaus. The slow rising/falling edges may be a rectilinear segment, a curve such as resulting from the charge/discharge of a capacitor in a resistor, or a succession of small upwards/downwards steps. A digital signal having a high-/low-state value may also be qualified as having a value 1 or 0 respectively.

SHORT DESCRIPTION OF THE DRAWINGS

In the drawings.

Further aspects of the invention will be explained in greater detail by way of examples and with reference to the accompanying drawings in which.

The drawings of the figures are neither drawn to scale nor proportioned.

DETAILED DESCRIPTION OF EMBODIMENTS OF THE INVENTION

Figure 1:
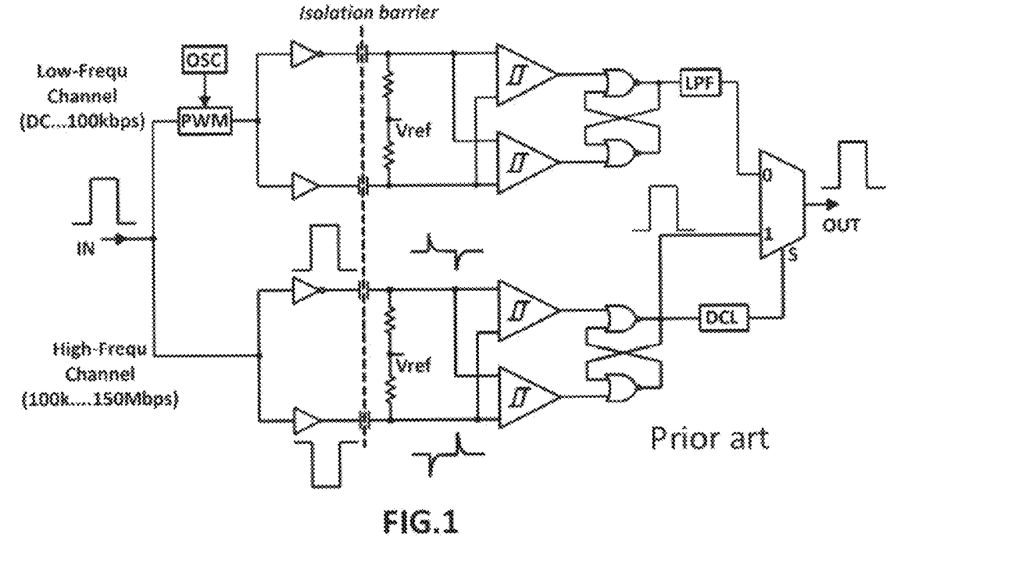
FIG. 1 is a conceptual block diagram of a known edge-based architecture of a digital isolator by Texas Instruments Incorporated from document SLLA284A.
Figure 2:
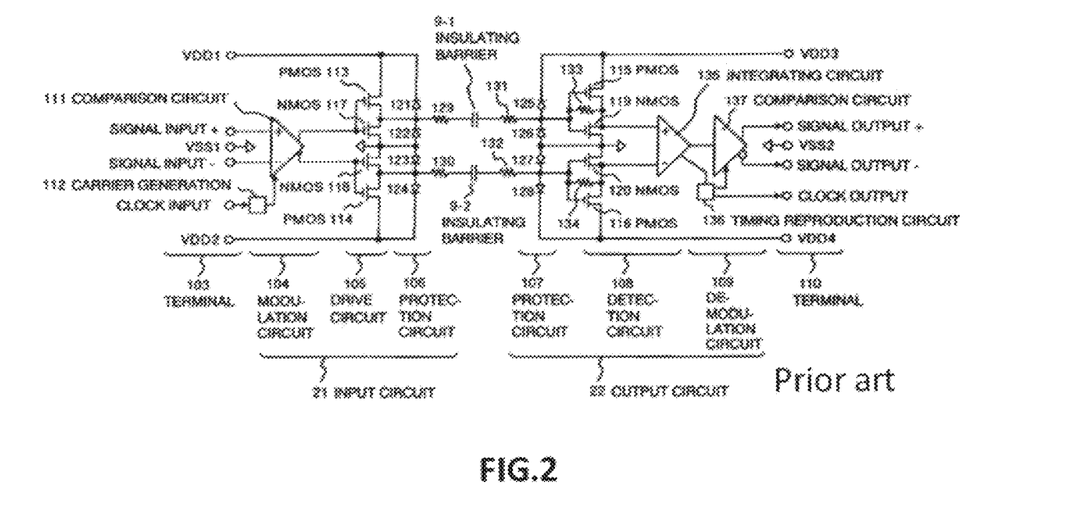
FIG. 2 is the schematic of one CMOS technology implementation of known isolation coupler having a capacitive barrier. This figure is FIG. 3 in document EP0973305A1.
Figure 3A:
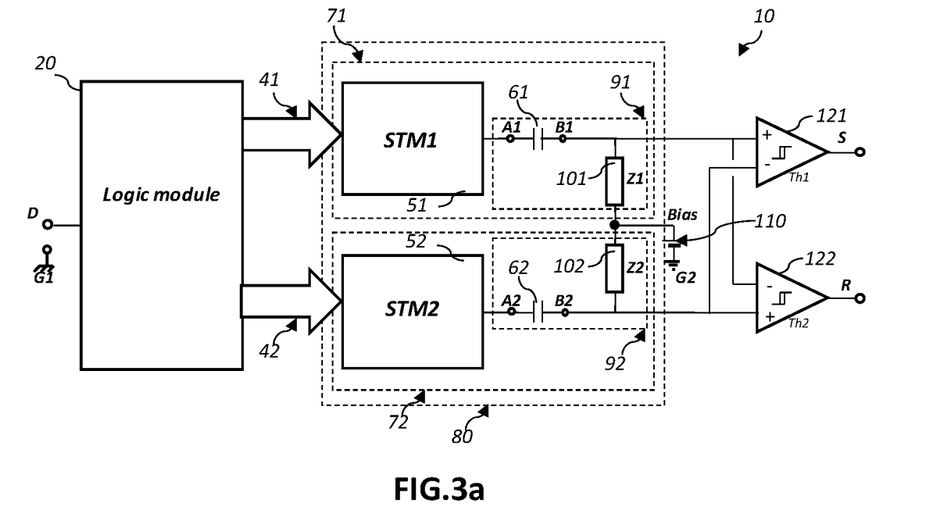
FIG. 3a is a block diagram of an isolator according to the invention.

FIG. 3a depicts a block diagram of a digital isolator 10 according to an embodiment of the invention. The digital isolator 10 is configured for receiving a digital signal D, with reference to a first ground G1, and for providing corresponding output signals S and R with reference to a second ground G2. The digital isolator 10 comprises a logic module 20 for receiving said digital signal D, and for providing first command signal 41 and second command signal 42 to respectively first sawtooth modulator STM1 51 and second sawtooth modulator STM2 52. The digital isolator 10 further comprises a differential link 80 comprising a first channel 71 and a second channel 72.

The first channel 71 comprises said first sawtooth modulator 51 for receiving first command signal 41 and for providing a first sawtooth signal at node A1. The first sawtooth signal will be described hereunder. The first channel further comprises a high pass filter 91 comprising a first capacitive coupling 61, represented as a single capacitor 61, and a first dipole 101 Z1. The first dipole may advantageously be a resistor. The dipole 101 Z1 is grounded trough a bias voltage source. The bias voltage source may be a short circuit, i.e. no bias voltage. The output signal of said high pass filter is presented at a node B1. When a high voltage may exist between the input and the output of the isolator, it may be useful to use a plurality of capacitors in series, in order to split the high voltage between each of said capacitors. The second channel 72 comprises corresponding components numbered 52, 42, A2, 92, 62, 102, B2, respectively. The logic module 20 is represented here as a single module, but may be also implemented in two parts, one for the first channel 71, and one for the second channel 72, at the condition that the same clock signal is used for both logic module blocks or that the signal clocks for the two blocks are synchronized. A first threshold comparator 121 having a first input connected to said node B1, and a second input connected to said node B2, produces a logical 1 output S when the difference between the value of its first input exceeds its second input by a threshold Th1, and logical 0 output otherwise such that only positive B1-B2 pulses larger than the threshold Th1 will generate a logical 1 pulse at output S. A second threshold comparator 122 having a first input connected to said node B2, and a second input connected to said node B1, produces a logical 1 output R when its first input exceeds its second input by a threshold Th2, and a logical 0 output otherwise such that only positive B2-B1 pulses larger than the threshold Th2 will generate a logical 1 pulse at the output R.

Figure 3B:
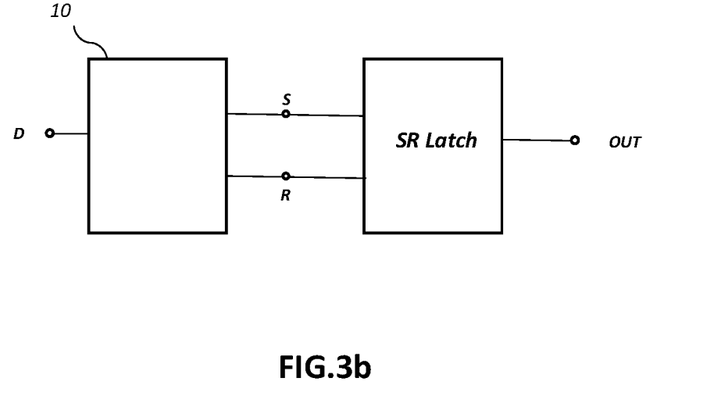
FIG. 3b is a block diagram of an isolator according to the invention, comprising an SR latch.

FIG. 3b depicts a block diagram of a digital isolator 10 according to a preferred embodiment of the invention. Signals S and R may be sent to an SR latch, in order to regenerate said input signal D as signal OUT. Alternatively, signals S and R may be sent to low-pass filters, peak detectors or other digital circuits in order to regenerate said input signal D as signal OUT.

Figure 4A:
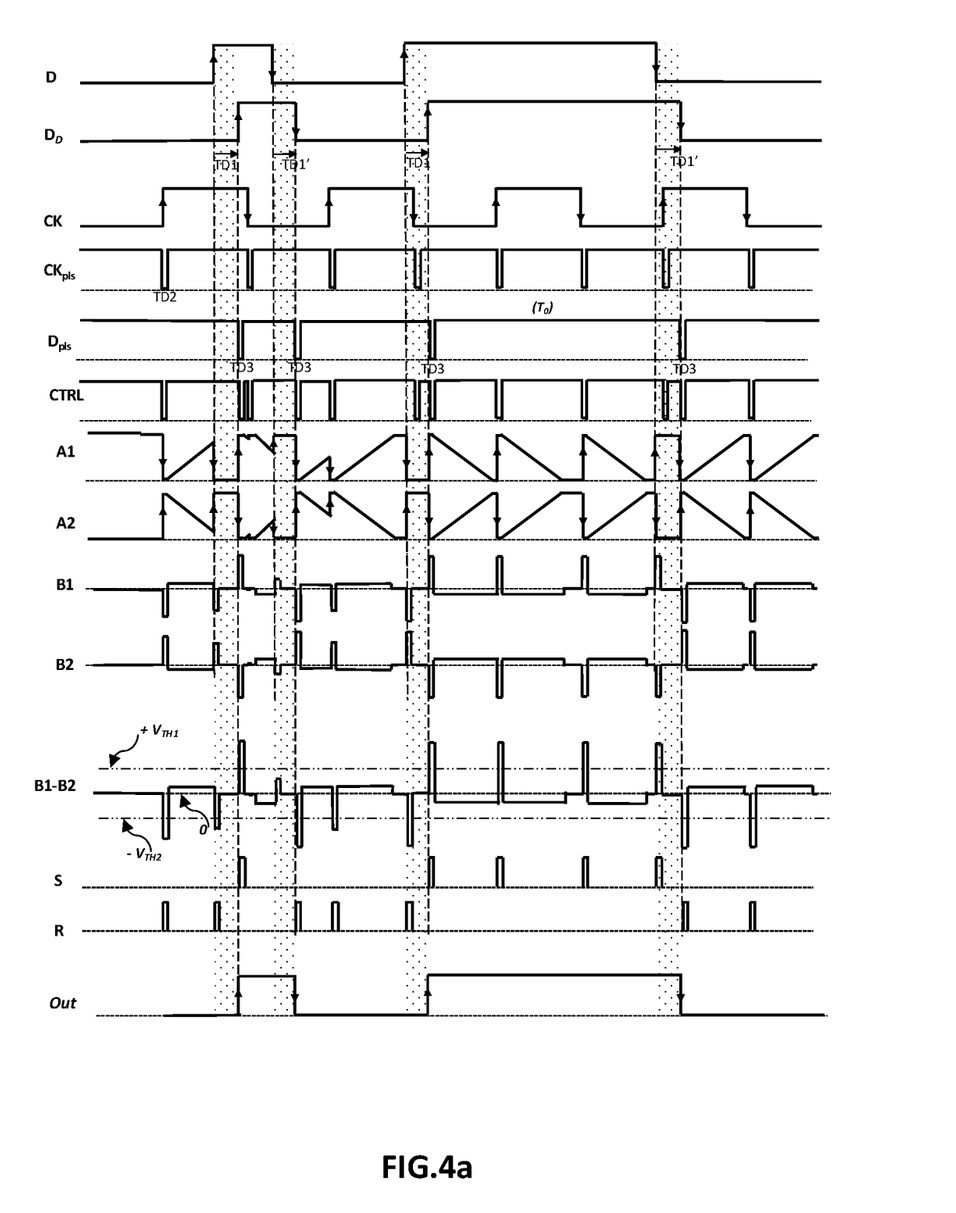
FIG. 4a represents typical signals at specific nodes of the isolator of FIG. 3a or FIG. 3b, in a case where the minimal duration TD0 of the low- or high-state pulses of D is larger than TD1 and TD1'.

FIG. 4a represents typical signals at specific nodes of the isolator of FIG. 3a or FIG. 3b, in a case where the minimal duration TD0 of the low- or high-state pulses of D is larger than TD1 and TD1'. This is the case when the digital signal is rather slow. An example of a digital signal D is represented in the first line. In an embodiment of the invention, a signal $D_D$ is produced by the logic module 20, presenting a rising edge a delay TD1 after a rising edge of D and a falling edge a delay TD1' after a falling edge of D. A pulse signal $CK_{pls}$ may be produced by the logic module 20. According to the example embodiment, the signal $CK_{pls}$ has high-state value, except for brief pulses of low-state values, of duration TD2. Such signal may be produced from a regular clock signal by using a circuit described hereunder. The low-state pulses of $CK_{pls}$ may be at constant interval, but the interval may vary in time. The duration TD2 may be a very short duration and may also vary. This is an example embodiment of the pulse signal $CK_{pls}$. The pulse signal $CK_{pls}$ may have any shape, such as a positive rectangular pulse, a Dirac or gaussian pulse. A signal $D_{pls}$ may also be produced by the logic module 20. The signal $D_{pls}$ has high-state value, except for brief pulses of low-state values, of duration TD3, that may overlap or promptly follow each transition of $D_D$. Such signal may be produced from the $D_D$ signal by using a circuit described hereunder.

Using the first/second command signal 41/42, the first and second sawtooth modulators produce sawtooth signals at nodes A1 and A2 respectively. These signals are filtered by high-pass filters 91 and 92 respectively, and the resulting filtered signals at nodes B1 and B2 are represented. As can be seen, fast rising/falling edges of signals at nodes A1 and A2 produce positive/negative brief pulses of high amplitudes at nodes B1 and B2. In contrast, slow rising/falling edges of signals at nodes A1 and A2 produce long positive/negative pulses of low amplitudes at nodes B1 and B2, and plateaus produce a signal of value 0 at nodes B1 and B2. Signal at node A2 is ideally a mirror image of signal at node A1 along a horizontal line at mid-height of the signal at node A1. The threshold comparators 121 and 122 receive the differences B1-B2 and B2-B1, respectively, and produce digital pulses S and R respectively. These two threshold comparators allow to obtain possibly non interleaved successive digital pulses at the occurrence of a pulse on $D_{pls}$ or on $CK_{pls}$ only on output S when input signal D is set to logic 1 and only on output R when input signal is set to 0. This allows the system to be set in the correct mode according to the channel S or R from where the fast output signal comes from. In case of large interferences at B1 or B2, if a wrong information is generated on output S or output R, the system corrects itself at the maximum time of two pulses of $CK_{pls}$ after the end of the fast parasitic transient. A parasitic is considered large when it can induce a differential voltage large enough to toggle comparators 121 or 122. In case of moderate parasitic at node B1 or node B2, the system will filter the wrong information aimed to the high-pass filters and will not take into account the wrong information making the system robust to moderate interferences on B1 or B2.

In the embodiment of FIG. 3b, these pulses may produce a signal OUT at the output of an SR latch. The signal OUT corresponds to the signal D after a delay TD1 and is isolated therefrom.

Preferably, the duration TD1 is selected as a short duration, in order to minimize the delay between the input and the output of the isolator. The duration between pulses of $CK_{pls}$ determines the delay of a regenerative S or R pulse after a parasitic perturbation of the isolator.

Although the pulse signal $CK_{pls}$ is depicted as derived from a clock signal CK, the pulses may occur at any rate and with any delay between successive pulses. The rate may vary according to the needs of the application. The rate of the $CK_{pls}$ pulses will govern the rate of redundant S and R pulses.

Figure 4B:
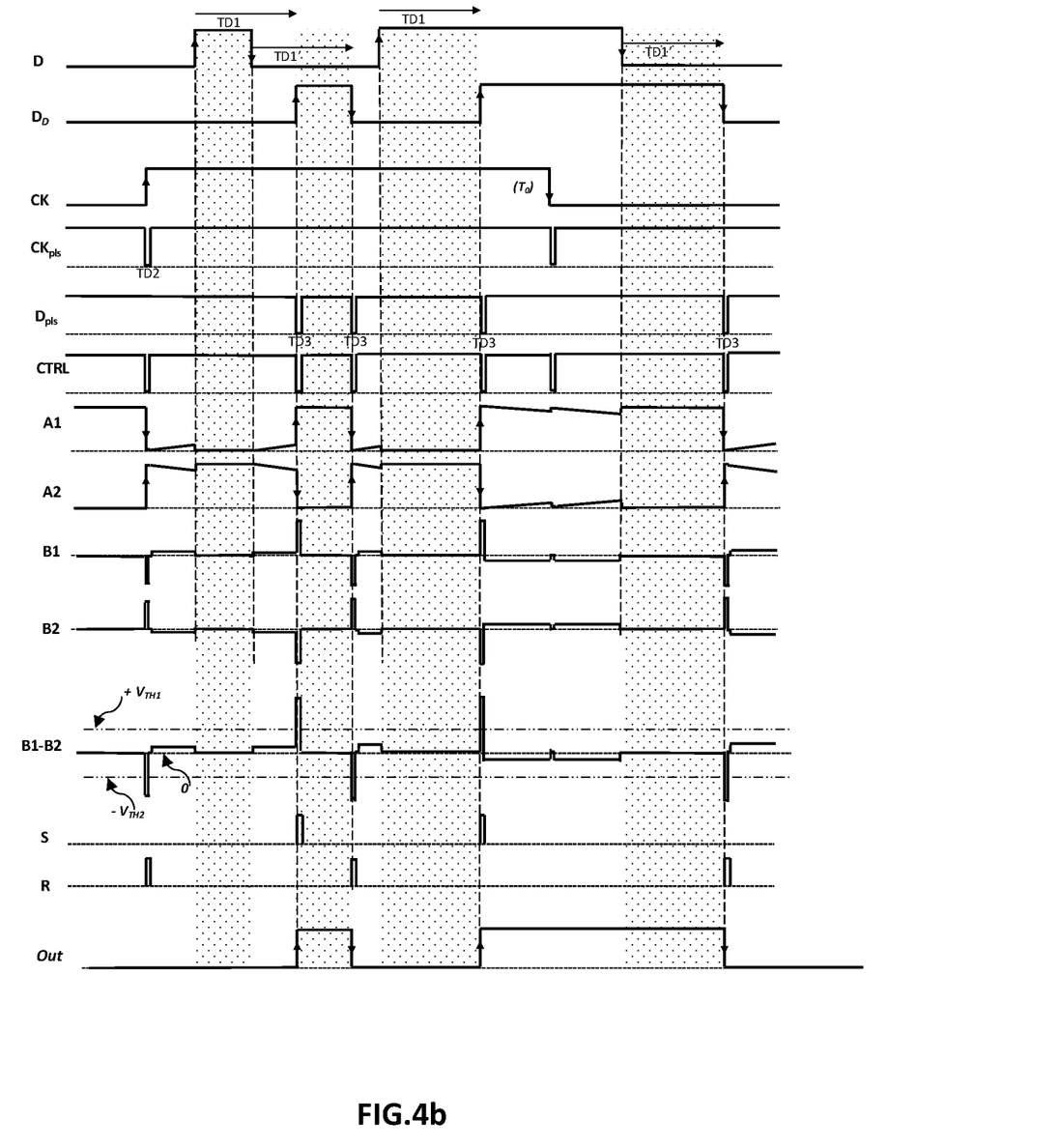
FIG. 4b represents typical signals at specific nodes of the isolator of FIG. 3a or FIG. 3b, in a case where the duration of the low- or high-state pulses of D may be shorter that TD1 or TD1'.

FIG. 4b represents typical signals at specific nodes of the isolator of FIG. 3a or FIG. 3b, in a case where the duration of the low- or high-state pulses of D may be shorter that TD1 or TD1'. This is the case when the digital signal is rather fast. In this situation, a transition of digital signal D may occur before delay TD1 or TD1' expires. As can be seen in the example case of FIG. 4b, the first downward transition of D occurs before the expiration of delay TD1. This starts a slow rising edge at node A1. The second downward transition of D occurs after the expiration of delay TD1. This results in a fast rising edge, followed by a high-state plateau on node A1. As can be seen the resulting signal Out correctly reproduces digital signal D, the rising edges being delayed by TD1 and the falling edges being delayed by TD1'.

As depicted on FIG. 4a and FIG. 4b, signals at nodes A1 and A2 have fast rising/falling edges, represented by up/down arrows when a transition from a low-state plateau to a high-state plateau or opposite occurs, or from slow edge to a plateau.

As can be seen from these figures, the first sawtooth signal at a node A1, has
    when $D=D_D=1$, a slow falling edge, possibly followed by
        a low-state plateau, until one of the following occurs:
            when a fast falling edge of D occurs, the first sawtooth signal has a sharp rising edge followed by a high state plateau;
            when a low state pulse of signal $CK_{pls}$ occurs, then the first sawtooth signal has a fast rising edge,
    when $D=D_D=0$, a slow rising edge, possibly followed by
        a high-state plateau, until one of the following occurs:
            when a fast rising edge of D occurs, the first sawtooth signal has a sharp falling edge followed by a low state plateau;
            when a low state pulses of signal $CK_{pls}$ occurs, then the first sawtooth signal has a fast falling edge.

when D=not($D_D$) (this corresponds to the dotted regions of FIG. 4a and FIG. 4b), the first sawtooth signal is equal to $D_D$.

As can also be seen from these figures, the second sawtooth signal at a node A2, has
- a fast falling edge when said first sawtooth signal has a fast rising edge;
- a fast rising edge when said first sawtooth signal has a fast falling edge;
- a high-state plateau when said first sawtooth signal has a low-state plateau;
- a low-state plateau when said first sawtooth signal has a high-state plateau;
- a slow falling edge when said first sawtooth signal has a slow rising edge;
- a slow rising edge when said first sawtooth signal has a slow falling edge.

Figure 4C:
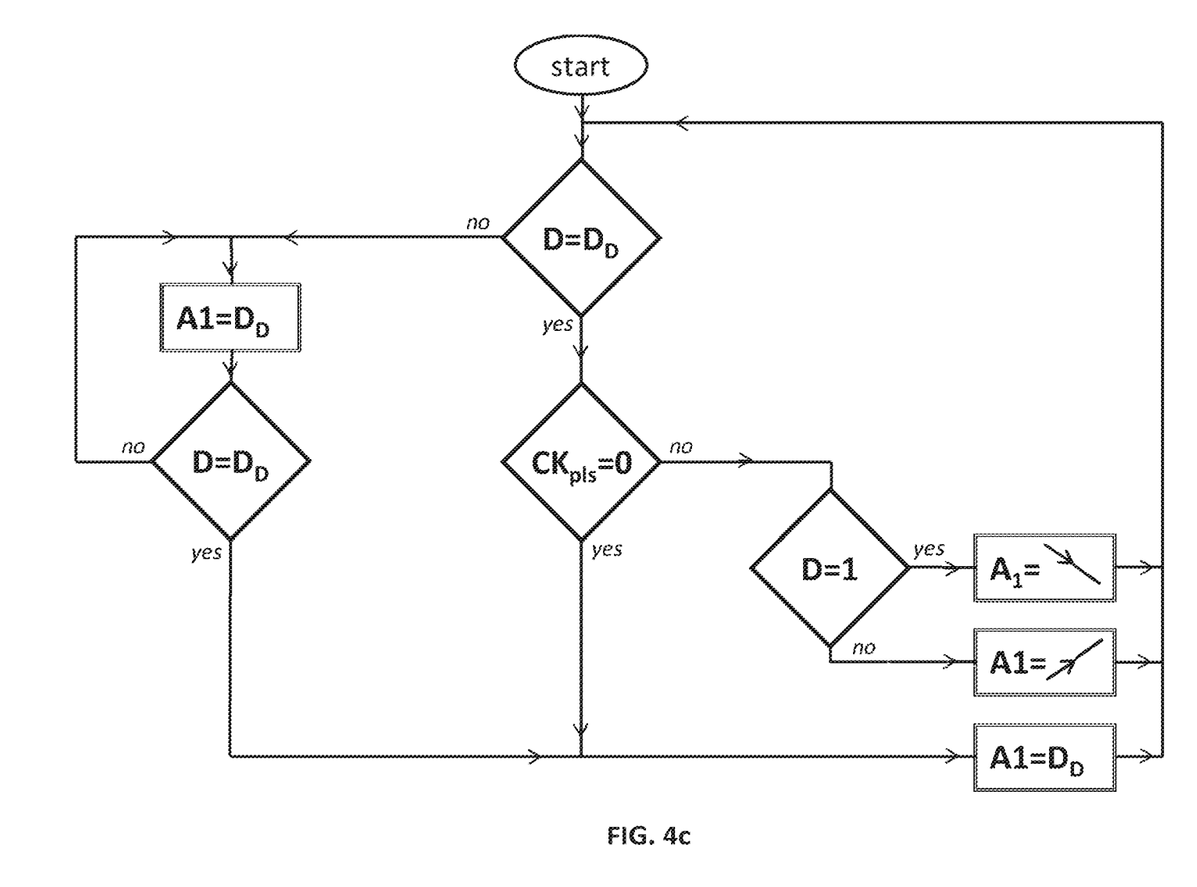
FIG. 4c is a flow chart representing the value of the signal at node A1, according the variations of the signals D, $D_D$ and $CK_{pls}$.

FIG. 4c is a flow chart representing the value of the signal at node A1, according the variations of the signals D, $D_D$ and $CK_{pls}$. An example course along the flow chart is as follows: A test on the equality of D and $D_D$ is performed. If the result is positive, a test of the of the occurrence of the pulse signal $CK_{pls}$ is executed. If the result is negative, a slow falling edge is produced on node A1, and one comes back to the first test. Other loops may be followed in the flow chart, according to the values of D, $D_D$ and $CK_{pls}$. A similar flow may be drawn for the signal at node A2.

Figure 5:
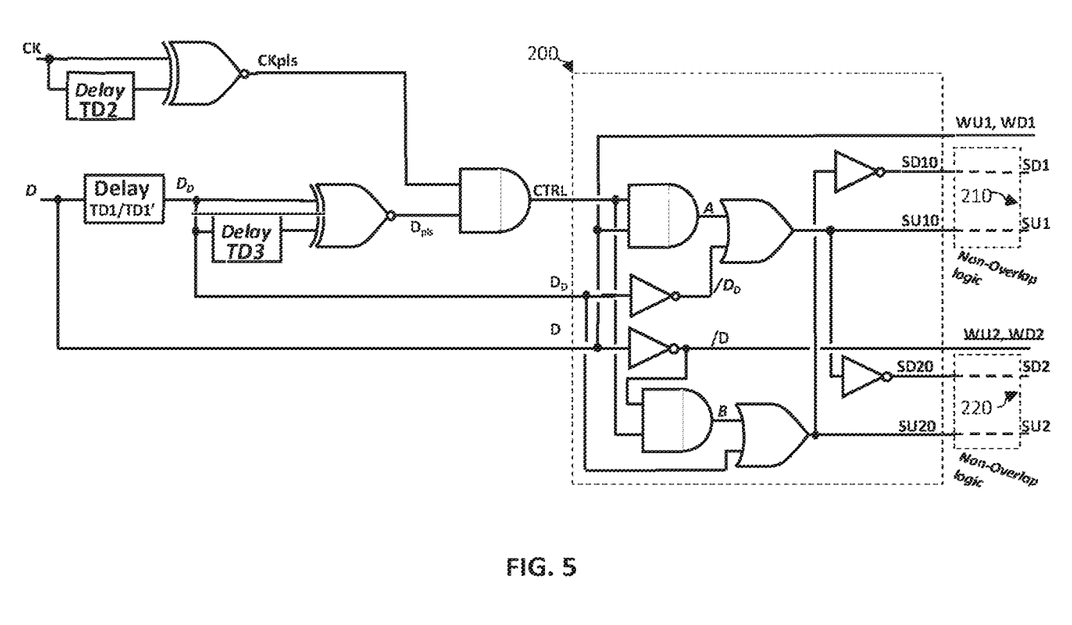
FIG. 5 is an embodiment of a logic module for use in a digital insulator according to embodiments of the invention.

FIG. 5 is an example of a logic module for use in a digital isolator according to embodiments of the invention. The signal $CK_{pls}$ may be obtained from a regular clock signal CK by using a delay of duration TD2 and an exclusive NOR gate (XNOR gate) receiving as inputs the clock signal and the delayed clock signal. In a similar way, signal $D_{pls}$ may be obtained from signal $D_D$. Signal CTRL is obtainable by combining signals $CK_{pls}$ and signal $D_{pls}$ in a AND gate. Signals D, $D_D$, and CTRL are inputs to a command logic module 200. Command logic module 200 is configured for producing command signals to the sawtooth modulators. In this embodiment, first command signal 41 comprises four individual signals SD1, SU1, WU1 and WD1. First sawtooth modulator 51 receives said signals and produce a fast falling edge (Strong Down transition) at node A1 when SD1=1 and SU1=1, a fast rising edge (Strong up transition) when SU1=0 and SD1=0, a slow rising edge (Weak Up transition) when SU1=1 SD1=0, WD1=0 and WU1=0 and a slow falling edge (Weak Down transition) when SU1=1 SD1=0, WU1=1 and WD1=1.

Second command signal 42 is related to command signal 41 as follows
WD2=not (WU1)
WU2=not (WD1)
SD2=not(SU1)
SU2=not(SD1)

The command logic module may be built by using logic gates such as AND gates, OR gates, inverters, as shown, but the skilled person will know alternative equivalent means for obtaining the requires command signals from the inputs D, $D_D$ and CTRL A non-overlap circuit 210 may be provided to generate signals SD1, SU1 from signals SD10, SU10. The non-overlap circuit will prevent the transient cases where SD1=1 and SU1=0 as such case would create a brief strong short-circuit of the supply V1 to the ground G1. A non-overlap circuit may be obtained by combining simple logic gates, as is well known in the art. A similar non-overlap circuit 220 may also be provided between signals SD20, SU20 and signals SD2, SU2.

Figure 6A:
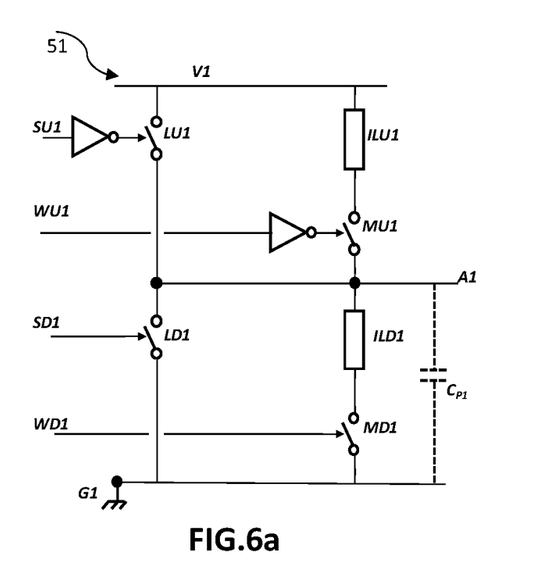
FIGS. 6a and 6b represent embodiments of sawtooth modulators for use in a digital insulator according to an embodiment of the invention.
Figure 6B:
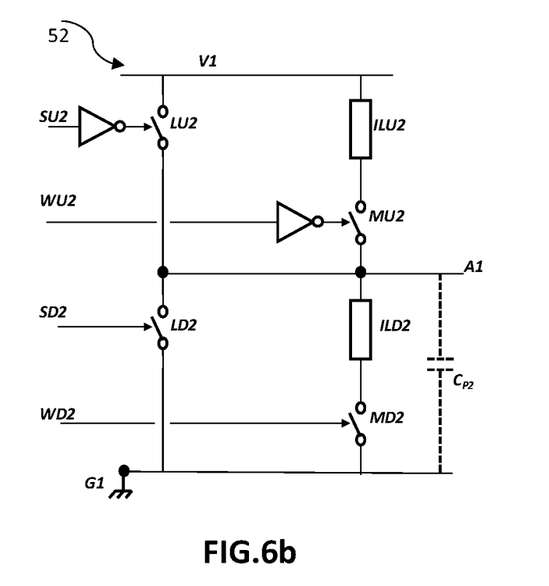

FIGS. 6a and 6b represent embodiments of sawtooth modulators 51 and 52 for use in a digital isolator according to an embodiment of the invention. A generic implementation using ideal switches or low-impedance switches of sawtooth modulator 51 is presented on figure FIG. 6a. In order to generate a sawtooth signal at node A1, said first sawtooth modulator 51, represented may comprise
- a first low impedance controllable switch LU1 connected between a first power supply voltage V1 and said output node A1, being closed when command signal SU1 is equal to 0 and open otherwise;
- a second low impedance controllable switch LD1 connected between said node A1 and said first ground G1, being closed when command signal SD1 is equal to 1 and open otherwise;
- a first controllable switch MU1 in series with a current limiting dipole ILU1 connected between said first power supply voltage V1 and said node A1, said first controllable switch MU1 being open when command signal WU1 is equal to 1 and closed otherwise;
- a second controllable switch MD1 in series with a current limiting dipole ILD1, connected between said node A1 and said first ground G1, second controllable switch being closed when command signal WD1 is equal to 1 and open otherwise;
- a capacitor Cp1 between said node A1 and ground G1.

The current limiting dipoles ILU1 and ILD1 may either be current sources or, resistors or, a combination thereof or any other current limiting structure. The values of these components and of the capacitor Cp1 are such that within the slow rising or falling edge, the sawtooth signals preferably reaches at least 80% of V1 or preferably reaches less than 20% of V1 respectively. Smaller dynamic range at the output node A1 would lead to poor signal magnitude at node B1, making it difficult for comparators 121 and 122 to correctly regenerate the S and R output signals. In a specific embodiment, Cp1 can be either a specific capacitor or a parasitic capacitance resulting from the technology used or a combination of capacitors. A parasitic capacitance may result, e.g. from the circuit layout, the assembly such as bonding or connection.

To generate a fast rising edge at node A1, SU1 is set to close said switch LU1 such that the capacitance Cp1 is promptly charged to V1 through LU1, while SD1 is set to open switch LD1 and WU1 and WD1 are set to preferably open switches MU1 and MD1 respectively.

To generate a slow rising edge at node A1, WU1 is set to 0 in order to close said switch MU1 such that the capacitance Cp1 is charged to V1 through MU1 and ILU1, while SD1, SU1, WD1 are set to open their corresponding switches.

To generate a fast falling edge of a sawtooth signal, SD1 is set to close said switch LD1 such that the capacitance Cp1 promptly discharges to ground G1 through LD1 while SU1 is set to open switch LU1 and WU1 and WD1 may preferably be set to open switches MU1 and MD1 respectively.

To generate a slow falling edge of a sawtooth signal, WD1 is set to 1 to close said switch MD1 such that the capacitance Cp1 is discharged to G1 through MD1 and ILD1, while SD1, WU1 and SU1 are set to open their corresponding switches.

The second sawtooth modulator 52, represented on FIG. 6b, may be built in a similar way to the first sawtooth modulator 51. As is well known to the skilled person, the low impedance controllable switches, and medium impedance controllable switches used in the invention may be implemented in various ways, such, for example with MOS- FETS, bipolar or any other kind of transistors or any kind of device that can modulate a conduction channel or any mechanical switching.

Sawtooth modulators 51 and 52 may be classically implemented for example but non exclusively, in CMOS technology, making use of transistors, or micro-electromechanical switches or any other kind of controlled elements as gates, or a logic circuit such as a microcontroller controlling a fast digital to analog converter.

As the differential link comprises two channels 71 and 72 of inversed logic, when a logic signal 1 is sent to the first line of the differential link, a logic signal 0 is sent to the second line of the differential link and when a logic signal 0 is sent to the first line of the differential link, a logic signal 1 is sent to the second line of the differential link. As a consequence, nodes A1 and A2, respectively B1 and B2, will receive signals of complementary logic values.

In case of unwanted parasitic signal injected on node B1 or node B2 producing a wrong information pulse due to some switching elements or due to surrounding electromagnetic noise or any other kind of noise, the system will auto correct itself after a maximum time delay of two $CK_{pls}$ signal period of time. This allows to drastically reduce the time during which the system may provide a wrong information.

The command logic is summarized in Table I, herebelow, wherein the first three columns show the possible combinations of the input signals to the command logic module 200, D, $D_D$ and CTRL. The next four columns represent the commands SU1, SD1, WU1 and WD1, provided by the command logic module 200 to the first sawtooth modulator, which are also the negatives of command signals SD2, SU2, WD2 and WU2 provided to the second sawtooth modulator, respectively (The notation /SD2 meaning the negation of logical signal SD2). In the table, the arrows indicate slow rising/falling edges. The value X means that the corresponding signal may take the value 1 or 0, independently for each case.

TABLE I

| D | $D_D$ | CTRL | SU1/ SD2 | SD1/ SU2 | WU1/ WD2 | WD1/ WU2 | A1 | A2 |
|---|---|---|---|---|---|---|---|---|
| 0 | 0 | 1 | 1 | 0 | 0 | 0 | ↗ | ↘ |
| 0 | 0 | 0 | 1 | 1 | X | X | 0 | 1 |
| 1 | 1 | 1 | 1 | 0 | 1 | 1 | ↘ | ↗ |
| 1 | 1 | 0 | 0 | 0 | X | X | 1 | 0 |
| 0 | 1 | 1 | 0 | 0 | X | X | 1 | 0 |
| 0 | 1 | 0 | 0 | 0 | X | X | 1 | 0 |
| 1 | 0 | 1 | 1 | 1 | X | X | 0 | 1 |
| 1 | 0 | 0 | 1 | 1 | X | X | 0 | 1 |

The isolator of the invention provides an improved isolation. According to the invention, specific waveforms are generated based on the digital input signal such that the output comparators can generate redundant consecutives S or R pulses (instead of interleaved ones). Applying these digital output S and R directly to an RS flip-flop, one obtains a digital redundancy of the input signal. If the first S or R signal is missed, the next occurrence will promptly correct the error and regenerate the output signal. The invention does not require a very high frequency technology and does not require analog low pass filtering at the output. All remain in the digital world, with a near to zero output jitter.

The description provides a way to generate adequate voltage waveforms to be transmitted across the isolation capacitors. However, other implementations could be used to generate such waveforms, such as, but not only, a microcontroller with fast digital to analog converters (DAC). The present invention is relative to the specific shapes of the waveforms to be generated so that non interleaved redundant Set and Reset pulses can be generated after the output comparators. Basically, the present invention is based on a sequence of plateau, fast or slow voltage transients that lead to possible non-interleaved S and R signals at the output.

Main advantages of the present invention are:
  No need of very advanced technology
  Lower current consumption thanks to lower internal frequencies
  No analog filtering, leading to less jitter and low delay.
  Possibility to adjust the redundancy rate of S and R pulses with a low frequency clock
  Compatible with fast digital input
  Only one differential channel is required for data and redundancy transmission
  Better EMI thanks to reduced amount of fast edges.

The invention claimed is:

1. A digital isolator comprising:
   a logic circuit arranged to:
     receive a first digital signal D;
     generate a first intermediate signal at a first intermediate node A1;
     generate a second intermediate signal that is inverse of the first intermediate signal, at a second intermediate node A2;
     generate a second digital signal $D_D$ that corresponds to the first digital signal D plus a predetermined delay time TD1;
     wherein the logic circuit is referenced to a first ground G1;
     wherein the logic circuit is further arranged to control the first intermediate signal, the second intermediate signal and the second digital signal $D_D$ in response to the first digital signal D, such that:
       when the first digital signal D transitions from a low state to a high state, the first intermediate signal transitions from a high state to a low state and remains in a low state for the predetermined delay time TD1;
       when the second digital signal $D_D$ transitions from a low state to a high state while the first digital signal D is in a high state, the first intermediate signal transitions from a low state to a high state and remains in a high state; and
       when the second digital signal $D_D$ transitions from a high state to a low state while the first digital signal D is in a low state, the first intermediate signal transitions from a high state to a low state.

2. The digital isolator of claim 1, further comprising a first isolation capacitor coupled between the first intermediate node A1 and a first input terminal of an output circuit.

3. The digital isolator of claim 2, further comprising a second isolation capacitor coupled between the second intermediate node A2 and a second input terminal of an output circuit.

4. The digital isolator of claim 3, wherein the first isolation capacitor is arranged to transmit the first intermediate signal to the first input terminal of the output circuit and the second isolation capacitor is arranged to transmit the second intermediate signal to the second input terminal of the output circuit.

5. The digital isolator of claim 4, wherein the output circuit is referenced to a second ground G2 and is arranged to generate an output signal OUT corresponding to the first digital signal D.

6. The digital isolator of claim 1, wherein the logic circuit comprises a logic module and a clock generation circuit.

7. The digital isolator of claim 5, further comprising a first impedance element coupled between the first input terminal of the output circuit and a bias voltage source referenced to the second ground G2.

8. The digital isolator of claim 7, further comprising a first impedance element coupled between the second input terminal of the output circuit and the bias voltage source.

9. The digital isolator of claim 8, wherein the output circuit comprises a first comparator having a first input node connected to the first isolation capacitor and a second input node connected to the second isolation capacitor.

10. The digital isolator of claim 9, wherein the output circuit further comprises a second comparator having a third input node connected to the first isolation capacitor and a fourth input node connected to the second isolation capacitor.

11. A method of operating a circuit, the method comprising:
providing a logic circuit;
receiving, by the logic circuit, a first digital signal D;
generating, by the logic circuit, a first intermediate signal at a first intermediate node A1;
generating, by the logic circuit, a second intermediate signal that is inverse of the first intermediate signal, at a second intermediate node A2;
generating, by the logic circuit, a second digital signal $D_D$ that corresponds to the first digital signal D plus a predetermined delay time TD1;
wherein the logic circuit is referenced to a first ground G1;
wherein the logic circuit is further arranged to control the first intermediate signal, the second intermediate signal and the second digital signal $D_D$ in response to the first digital signal D, such that:
when the first digital signal D transitions from a low state to a high state, the first intermediate signal transitions from a high state to a low state and remains in a low state for the predetermined delay time TD1;
when the second digital signal $D_D$ transitions from a low state to a high state while the first digital signal D is in a high state, the first intermediate signal transitions from a low state to a high state and remains in a high state; and
when the second digital signal $D_D$ transitions from a high state to a low state while the first digital signal D is in a low state, the first intermediate signal transitions from a high state to a low state.

12. The method of claim 11, further comprising providing a first isolation capacitor coupled between the first intermediate node A1 and a first input terminal of an output circuit.

13. The method of claim 12, further comprising providing a second isolation capacitor coupled between the second intermediate node A2 and a second input terminal of an output circuit.

14. The method of claim 13, wherein the first isolation capacitor is arranged to transmit the first intermediate signal to the first input terminal of the output circuit and the second isolation capacitor is arranged to transmit the second intermediate signal to the second input terminal of the output circuit.

15. The method of claim 14, wherein the output circuit is referenced to a second ground G2 and is arranged to generate an output signal OUT corresponding to the first digital signal D.

16. The method of claim 15, further comprising providing a first impedance element coupled between the first input terminal of the output circuit and a bias voltage source referenced to the second ground G2.

17. The method of claim 16, further comprising providing a second impedance element coupled between the second input terminal of the output circuit and the bias voltage source.

18. The method of claim 17, wherein the output circuit comprises a first comparator having a first input node connected to the first isolation capacitor and a second input node connected to the second isolation capacitor.

19. The method of claim 18, wherein the output circuit further comprises a second comparator having a third input node connected to the first isolation capacitor and a fourth input node connected to the second isolation capacitor.

* * * * *